(12) United States Patent
Powell et al.

(10) Patent No.: US 11,371,163 B2
(45) Date of Patent: *Jun. 28, 2022

(54) STABILIZED, HIGH-DOPED SILICON CARBIDE

(71) Applicant: Wolfspeed, Inc., Durham, NC (US)

(72) Inventors: Adrian Powell, Cary, NC (US); Al Burk, Chapel Hill, NC (US); Michael O'Loughlin, Chapel Hill, NC (US)

(73) Assignee: Wolfspeed, Inc., Durham, NC (US)

( * ) Notice: Subject to any disclaimer, the term of this patent is extended or adjusted under 35 U.S.C. 154(b) by 5 days.

This patent is subject to a terminal disclaimer.

(21) Appl. No.: 16/751,246

(22) Filed: Jan. 24, 2020

(65) Prior Publication Data

US 2020/0157705 A1    May 21, 2020

Related U.S. Application Data

(63) Continuation of application No. 15/398,185, filed on Jan. 4, 2017, now Pat. No. 10,577,720.

(51) Int. Cl.
*C30B 29/36* (2006.01)
*H01L 29/16* (2006.01)
(Continued)

(52) U.S. Cl.
CPC .............. *C30B 29/36* (2013.01); *C30B 23/02* (2013.01); *C30B 23/025* (2013.01);
(Continued)

(58) Field of Classification Search
CPC .......... C30B 23/00; C30B 23/02; C30B 29/36
See application file for complete search history.

(56) References Cited

U.S. PATENT DOCUMENTS 8,147,991 B2   4/2012   Jenny et al.
8,377,806 B2   2/2013   Leonard et al.
(Continued)

FOREIGN PATENT DOCUMENTS

EP    2940196    11/2015
EP    3040452    7/2016
(Continued)

OTHER PUBLICATIONS

Examination Report corresponding to European Patent Application No. 17829453.4 (7 pages) (dated Jul. 22, 2020).
(Continued)

*Primary Examiner* — Robert M Kunemund
(74) *Attorney, Agent, or Firm* — Myers Bigel, P.A.

(57) ABSTRACT

Stabilized, high-doped silicon carbide is described. A silicon carbide crystal is grown on a substrate using chemical vapor deposition so that the silicon carbide crystal includes a dopant and the strain compensating component. The strain compensating component can be an isoelectronic element and/or an element with the same majority carrier type as the dopant. The silicon carbide crystal can then be cut into silicon carbide wafers. In some embodiments, the dopant is n-type and the strain compensating component is selected from a group comprising germanium, tin, arsenic, phosphorus, and combinations thereof. In some embodiments, the strain compensating component comprises germanium and the dopant is nitrogen.

15 Claims, 3 Drawing Sheets

(51) Int. Cl.
- *H01L 29/167* (2006.01)
- *H01L 29/36* (2006.01)
- *C30B 23/02* (2006.01)
- *C30B 23/06* (2006.01)
- *C30B 33/00* (2006.01)

(52) U.S. Cl.
CPC .......... *C30B 23/063* (2013.01); *C30B 23/066* (2013.01); *C30B 33/00* (2013.01); *H01L 29/167* (2013.01); *H01L 29/1608* (2013.01); *H01L 29/36* (2013.01)

(56) References Cited

U.S. PATENT DOCUMENTS

| | | |
|---|---|---|
| 9,048,166 B2 | 6/2015 | Leonard et al. |
| 2002/0104478 A1 | 8/2002 | Oguri et al. |
| 2010/0080956 A1 | 4/2010 | Fujimoto et al. |
| 2012/0025153 A1 | 2/2012 | Hirose et al. |
| 2013/0240902 A1 | 9/2013 | Schulze et al. |
| 2014/0284620 A1 | 9/2014 | Ota et al. |
| 2015/0034974 A1 | 2/2015 | Nishio et al. |
| 2016/0197164 A1 | 7/2016 | Schulze et al. |
| 2016/0208411 A1* | 7/2016 | Shirai ................... C30B 17/00 |

FOREIGN PATENT DOCUMENTS

| | | |
|---|---|---|
| EP | 3051009 | 8/2016 |
| JP | 2012031014 A | 2/2012 |
| JP | 2015048265 A | 3/2015 |
| JP | 2015067479 A | 4/2015 |
| JP | 2016052961 | 4/2016 |

OTHER PUBLICATIONS

Translation of Japanese Office Action corresponding to Japanese Patent Application No. 2019-556788, dated Aug. 25, 2020, 7 pages.
Cree, Inc. International Application No. PCT/US2017/067189, International Search Report and Written Opinion, dated Mar. 20, 2018.
Notification Concerning Transmittal of International Report on Patentability corresponding to International Application No. PCT/US2017/067189, dated Jul. 18, 2019.
Suo, H., et al. "Bulk Growth of Low Resistivity n-type 4H-SiC Using Co-Doping," 11th European Conference on Silicon Carbide and Related Materials, Sep. 2016, pp. 123-124.

* cited by examiner

STABILIZED, HIGH-DOPED SILICON CARBIDE

RELATED APPLICATIONS

The present application is a continuation of U.S. patent application Ser. No. 15/398,185, filed Jan. 4, 2017 now U.S. Pat. No. 10,577,720, and entitled "STABILIZED, HIGH-DOPED SILICON CARBIDE," the entire contents of each of which are incorporated by reference herein for all purposes.

BACKGROUND

Silicon carbide (SiC) exhibits many attractive electrical and thermophysical properties. Silicon carbide is especially useful due to its physical strength and high resistance to chemical attack. Silicon carbide also has excellent electronic properties, including radiation hardness, high breakdown field, a relatively wide band gap, high saturated electron drift velocity, high temperature operation, and absorption and emission of high energy photons in the blue, violet, and ultraviolet regions of the spectrum. Some of the properties of SiC make it suitable for the fabrication of high power density solid state devices.

SiC is often produced by a seeded sublimation growth process. In a typical silicon carbide growth technique, a substrate and a source material are both placed inside of a reaction crucible. A thermal gradient created when the crucible is heated encourages vapor phase movement of the materials from the source material to the substrate followed by condensation upon the substrate and resulting bulk crystal growth.

It is known that impurities can be introduced as dopants into SiC and that these dopants can regulate certain properties. If the SiC is produced in a sublimation growth process as discussed immediately above, a dopant can be introduced into the chamber in any of various ways so that the dopant will be present in the SiC crystal produced from that process. The process is controlled to provide an appropriate concentration of the dopant for a particular application.

SUMMARY

Embodiments of the present invention make use of a strain compensating component to allow high doping and hence high conductivity in SiC crystals and wafers. In some embodiments, a method of producing a SiC crystal includes placing a seed in a growth zone and positioning a source material in the growth zone, wherein the source material includes a dopant and the strain compensating component. The SiC crystal is grown on the seed so that the SiC crystal includes the dopant and the strain compensating component. The SiC crystal can then be cut into SiC wafers. The strain compensating component can be any element that introduces an opposing strain into the SiC lattice such that the total net strain is reduced. To achieve this, the concentration of the strain compensating element can be between 1% and 20% of the concentration of the dopant. In some embodiments, the concentration will be between 1% and 180%. In some embodiments, the concentration will be between 3% and 120%. In some embodiments, the concentration will be between 5% and 100%. In some embodiments, the concentration will bet between 20% and 100%.

In some embodiments of the invention, the strain compensating component is selected from a group comprising germanium, tin, arsenic, phosphorus, and combinations thereof. In some embodiments, a concentration of the strain compensating component is from $1 \times 10^{17}$ cm$^{-3}$ to $2 \times 10^{21}$ cm$^{-3}$. In some embodiments, a concentration of the strain compensating component is from $2 \times 10^{17}$ cm$^{-3}$ to $2 \times 10^{20}$ cm$^{-3}$. In some embodiments, the concentration of the strain compensating component is from $2 \times 10^{17}$ cm$^{-3}$ to $1.8 \times 10^{20}$ cm$^{-3}$. In some embodiments, the concentration of the strain compensating component is from $2 \times 10^{17}$ cm$^{-3}$ to $1 \times 10^{20}$ cm$^{-3}$. In some embodiments, the concentration of the strain compensating component is from $1 \times 10^{18}$ cm$^{-3}$ to $1.8 \times 10^{20}$ cm$^{-3}$. In some embodiments, the concentration of the strain compensating component is from $1 \times 10^{18}$ cm$^{-3}$ to $1.8 \times 10^{19}$ cm$^{-3}$. In some embodiments, the concentration of the strain compensating component is from $1 \times 10^{18}$ cm$^{-3}$ to $1 \times 10^{19}$ cm$^{-3}$. In some embodiments, the strain compensating component comprises germanium. In some embodiments, a concentration of germanium in the silicon carbide crystal is from $1 \times 10^{17}$ cm$^{-3}$ to $2 \times 10^{21}$ cm$^{-3}$. In some embodiments where germanium is used, the concentration of germanium in the SiC crystal and/or wafer is from $2 \times 10^{17}$ cm$^{-3}$ to $2 \times 10^{20}$ cm$^{-3}$. In some embodiments where germanium is used, the concentration of germanium in the SiC crystal is from $1 \times 10^{18}$ cm$^{-3}$ to $1 \times 10^{19}$ cm$^{-3}$.

In some embodiments, the concentration of a dopant in a SiC crystal and/or wafer is from $1 \times 10^{18}$ cm$^{-3}$ to $1 \times 10^{21}$ cm$^{-3}$. In some embodiments, the concentration of a dopant in a SiC crystal and/or wafer is from $1 \times 10^{18}$ cm$^{-3}$ to $1.8 \times 10^{20}$ cm$^{-3}$. In some embodiments, the concentration of a dopant in a SiC crystal is from $1 \times 10^{18}$ cm$^{-3}$ to $1 \times 10^{20}$ cm$^{-3}$. In some embodiments, the concentration of a dopant in a SiC crystal is from $1 \times 10^{18}$ cm$^{-3}$ to $1.8 \times 10^{19}$ cm$^{-3}$. In some embodiments, the concentration of a dopant in a SiC crystal and/or wafer is from $1 \times 10^{18}$ cm$^{-3}$ to $1 \times 10^{20}$ cm$^{-3}$. In some embodiments, the dopant in a SiC crystal and/or wafer comprises nitrogen. In some embodiments where the dopant comprises nitrogen, the concentration of nitrogen in the SiC crystal and/or is from $1 \times 10^{18}$ cm$^{-3}$ to $1 \times 10^{21}$ cm$^{-3}$. In some embodiments where the dopant comprises nitrogen, the concentration of nitrogen in the SiC crystal and/or is from $1 \times 10^{18}$ cm$^{-3}$ to $1.8 \times 10^{20}$ cm$^{-3}$. In some embodiments where the dopant is nitrogen, the concentration of nitrogen in the SiC crystal and/or wafer is from $1 \times 10^{18}$ cm$^{-3}$ to $1 \times 10^{20}$ cm$^{-3}$. In some embodiments where the dopant is nitrogen, the concentration of nitrogen in the SiC crystal and/or wafer is from $1 \times 10^{18}$ cm$^{-3}$ to $1 \times 10^{19}$ cm$^{-3}$.

A SiC wafer according to some embodiments has a dimension of from 50 mm to 300 mm and comprises a strain compensating component and a dopant. In some embodiments, the concentration of the strain compensating component in the SiC wafer is from 1% to 180% of the concentration of the dopant, and the strain compensating component includes an isoelectronic element and/or an element with the same majority carrier type as the dopant. In some embodiments, the concentration will be between 1% and 20%. In some embodiments, the concentration will be between 3% and 120%. In some embodiments, the concentration will be between 5% and 100%. In some embodiments, the concentration will be between 20% and 100%. In some embodiments, the strain compensating component is selected from a group comprising germanium, tin, arsenic, phosphorus, and combinations thereof, and the dopant is an n-type dopant. In some embodiments, the dopant comprises nitrogen and the strain compensation component comprises germanium.

A SiC wafer according to some embodiments has a dimension of from 50 mm to 300 mm and a resistivity of less than 0.01 ohm-cm, wherein the SiC wafer comprises nitrogen in a concentration from $1 \times 10^{18}$ cm$^{-3}$ to $1 \times 10^{21}$ cm$^{-3}$. In some embodiments, the concentration of nitrogen is from $1 \times 10^{18}$ cm$^{-3}$ to $1 \times 10^{20}$ cm$^{-3}$. In some embodiments, the concentration of nitrogen is from $1 \times 10^{18}$ cm$^{-3}$ to $1 \times 10^{19}$ cm$^{-3}$. In some embodiments, the SiC wafer further comprises a strain compensating component at a concentration 1% to 180% of the concentration of the nitrogen. In some embodiments, the concentration will be between 1% and 20%. In some embodiments, the concentration will be between 3% and 120%. In some embodiments, the concentration will be between 5% and 100%. In some embodiments, the concentration will be between 20% and 100%. In some embodiments, the strain compensating component is selected from a group comprising germanium, tin, arsenic, phosphorus, and combinations thereof. In some embodiments, the strain compensating component comprises germanium.

DETAILED DESCRIPTION

Figure 1A:
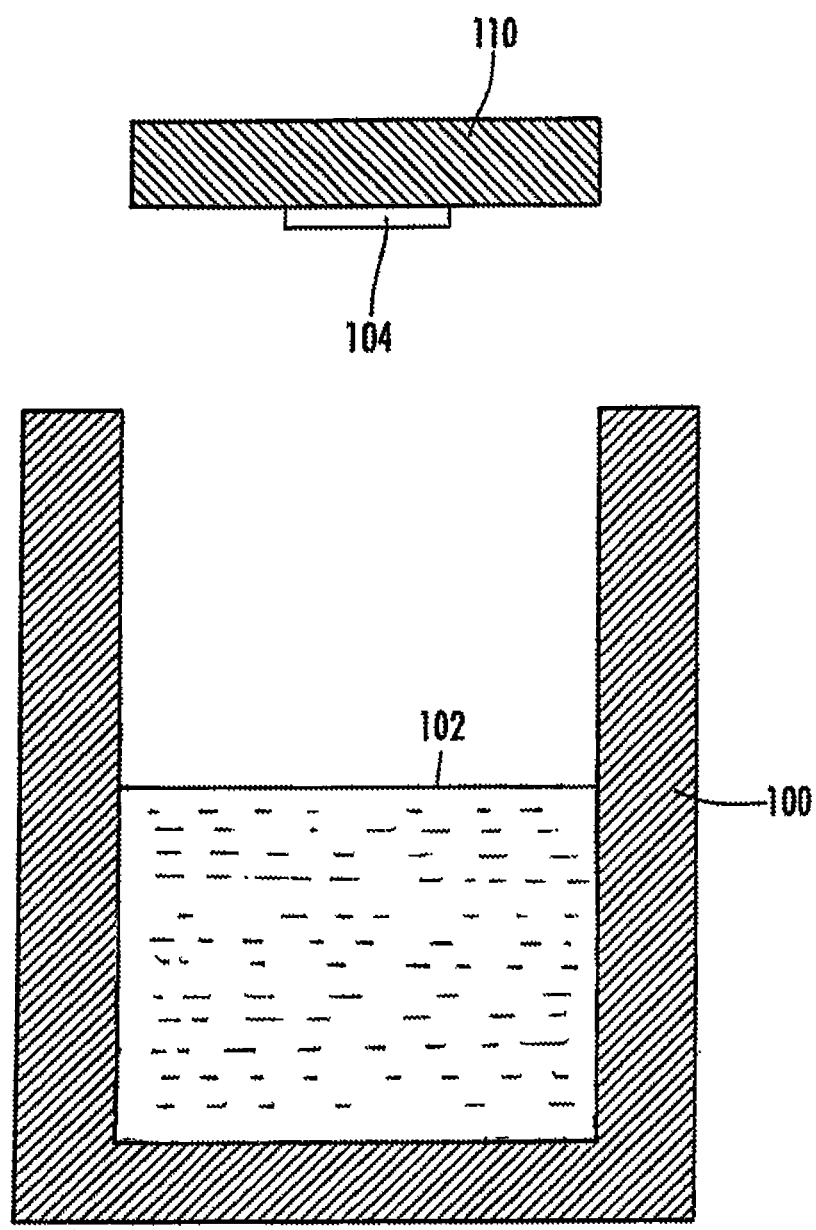
FIG. 1A and FIG. 1B illustrate a method of producing a crystal and a crystal being grown according to example embodiments of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

Highly doped n-type SiC will form stacking faults when a bias is applied to a device structure. It is believed that this stacking fault formation and propagation is due to high tensile stress induced by the presence of the dopant (for example, nitrogen) in the crystal lattice. Embodiments of the present invention make use of a strain compensating component to allow high doping and hence high conductivity in SiC crystals, wafers, and devices. The strain compensating component induces a compressive stress in the lattice and counterbalances the tensile stress induced by the dopant atoms to produce unstressed, and thus, stabilized material that does not degrade when a bias voltage is applied. The material will have higher conductivity due to the higher doping, but without the tendency to form stacking faults. These characteristics can be advantageous when the material is to be used for lower voltage devices.

While various elements might serve in terms of counterbalancing the stress, an element that is opposite the majority carrier type relative to the dopant will compromise the conductivity of the material and reduce or cancel out any gain in conductivity obtained by using higher dopant concentrations. Thus, embodiments of the invention use a strain compensating component that is an isoelectronic element or an element with the same majority carrier type as the dopant, or a combination of the two. Germanium, tin, arsenic, and phosphorus are examples. The strain compensating component can be a single element or a combination of elements.

Figure 1B:
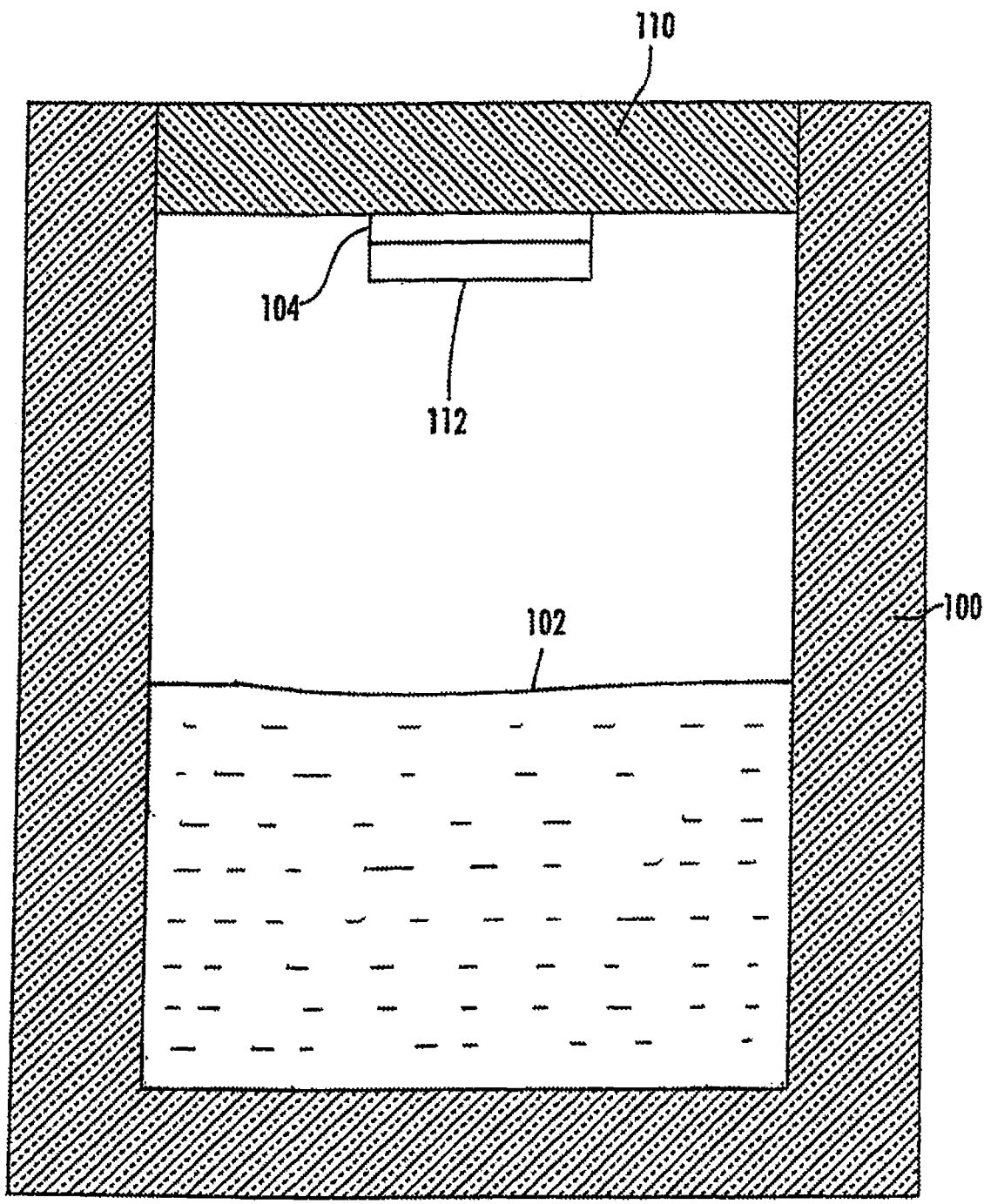

FIG. 1A and FIG. 1B illustrate the process of growing a crystal according to example embodiments of the invention. In FIG. 1A, crucible 100 contains source material 102. In this example, the interior of the crucible serves as a growth zone. Source material 102 can include silicon, carbon, SiC, silicon compounds, carbon compounds, or combinations of any or all of the foregoing. Other elements such as nitrogen as the dopant and germanium as the strain compensating component can be included in the source material. Alternatively one, some, or all of the other elements can be introduced into the growth zone in ways other than inclusion in the source material. A seed 104 is fixed to crucible lid 110. The lid 110 with the seed 104 is placed on crucible 100 so that the seed is suspended in the crucible above the source material, and crucible 100 is heated. As previously discussed, the strain compensating component should be either isoelectronic or have the same majority carrier type (n-type or p-type, donor or acceptor) as the dopant. Other potential strain compensating elements include tin, arsenic, and phosphorus.

The source material sublimes and forms SiC on the seed. Sublimation occurs when the growth zone is heated to a temperature from 1800 C to 2500 C. While the temperature of the source material is being raised, the temperature of the growth surface of the seed is likewise raised to a temperature approaching the temperature of the source material. Typically, the growth surface of the seed is heated to a temperature from about 1700 C to about 2400 C. During the growth process, the crucible is evacuated slowly to reduce pressure. By maintaining the source material and the growth surface of the SiC seed at their respective temperatures for a sufficient time, macroscopic growth of monocrystalline SiC of a desired polytype will form upon the seed.

Turning to FIG. 1B, the SiC crystal is grown from source material in a crucible using a physical vapor transport process. Crystal growth takes place until the grown crystal 112 reaches its desired length. The length chosen depends in part on the type of post-formation processing to be employed. The point where the growth of crystal 112 should be stopped will also depend on such parameters as the size and type of crucible and any concentration of the dopant and strain compensating component in source material 102. This point can be determined in advance through experimental growths coupled with examination of crystal 112 to determine concentrations of the impurities.

Sublimation growth of SiC can be accomplished with various growth systems, differently sized crucibles, different types of crucibles of various materials and using varying heating methods. Specific growth temperatures and pressures can be adapted by one of skill in the art to accommodate these variables. In the typical case, where such variables as the type or size of the crucible are changed, experimental growths may need to be performed as mentioned above, to settle on the best growth conditions for a specific system.

In some embodiments, the SiC crystal is grown so that the concentration of the strain compensating component in the SiC crystal is between 1% and 20% of the concentration of the dopant. In some embodiments, the concentration will be between 1% and 180%. In some embodiments, the concentration will be between 3% and 120%. In some embodiments, the concentration will be between 5% and 100%. In some embodiments, the concentration will bet between 20% and 100%. In some embodiments, a concentration of the strain compensating component is from $1 \times 10^{17}$ cm$^{-3}$ to $2 \times 10^{21}$ cm$^{-3}$. In some embodiments, a concentration of the strain compensating component is from $2 \times 10^{17}$ cm$^{-3}$ to $2 \times 10^{20}$ cm$^{-3}$. In some embodiments, the concentration of the strain compensating component is from $2 \times 10^{17}$ cm$^{-3}$ to $1.8 \times 10^{20}$ cm$^{-3}$. In some embodiments, the concentration of the strain compensating component is from $2 \times 10^{17}$ cm$^{-3}$ to $1 \times 10^{20}$ cm$^{-3}$. In some embodiments, the concentration of the strain compensating component is from $1 \times 10^{18}$ cm$^{-3}$ to $1.8 \times 10^{20}$ cm$^{-3}$. In some embodiments, the concentration of the strain compensating component is from $1 \times 10^{18}$ cm$^{-3}$ to $1.8 \times 10^{19}$ cm$^{-3}$. In some embodiments, the concentration of the strain compensating component is from $1 \times 10^{18}$ cm$^{-3}$ to $1 \times 10^{19}$ cm$^{-3}$.

In some embodiments a SiC crystal has a dimension of from 50 mm to 300 mm and a resistivity of less than 0.01 ohm-cm, wherein the SiC crystal will include nitrogen as the dopant in a concentration from $1 \times 10^{18}$ cm$^{-3}$ to $1 \times 10^{21}$ cm$^{-3}$. In some embodiments, the concentration of nitrogen will be from $1 \times 10^{18}$ cm$^{-3}$ to $1.8 \times 10^{20}$ cm$^{-3}$. In some embodiments, the concentration of nitrogen will be from $1 \times 10^{18}$ cm$^{-3}$ to $1.8 \times 10^{19}$ cm$^{-3}$. The SiC crystal can include any dopant in a concentration from $1 \times 10^{18}$ cm$^{-3}$ to $1 \times 10^{21}$ cm$^{-3}$, from $1 \times 10^{18}$ cm$^{-3}$ to $1 \times 10^{20}$ cm$^{-3}$, from $1 \times 10^{18}$ cm$^{-3}$ to $1.8 \times 10^{19}$ cm$^{-3}$, or from $1 \times 10^{18}$ cm$^{-3}$ to $1 \times 10^{20}$ cm$^{-3}$. The source material in the crucible can be provided in any of various forms, including but not limited to solid, powder, or gas. The source material can include silicon, carbon, SiC, silicon compounds, carbon compounds, or combinations of any or all of the foregoing. Other elements such as nitrogen as the dopant and germanium as the strain compensating component can be included in the source material. Alternatively one, some, or all of the other elements can be introduced into the growth zone in ways other than inclusion in the source material. Once the growing crystal of SiC has reached the desired size, the system is backfilled with an inert gas to raise the pressure, and the temperature is slowly reduced to an intermediate temperature, and then more quickly to room temperature. The intermediate temperature can be from about 150 C to about 500 C. In some embodiments, the intermediate temperature is from about 175 C to about 225 C.

Figure 2:
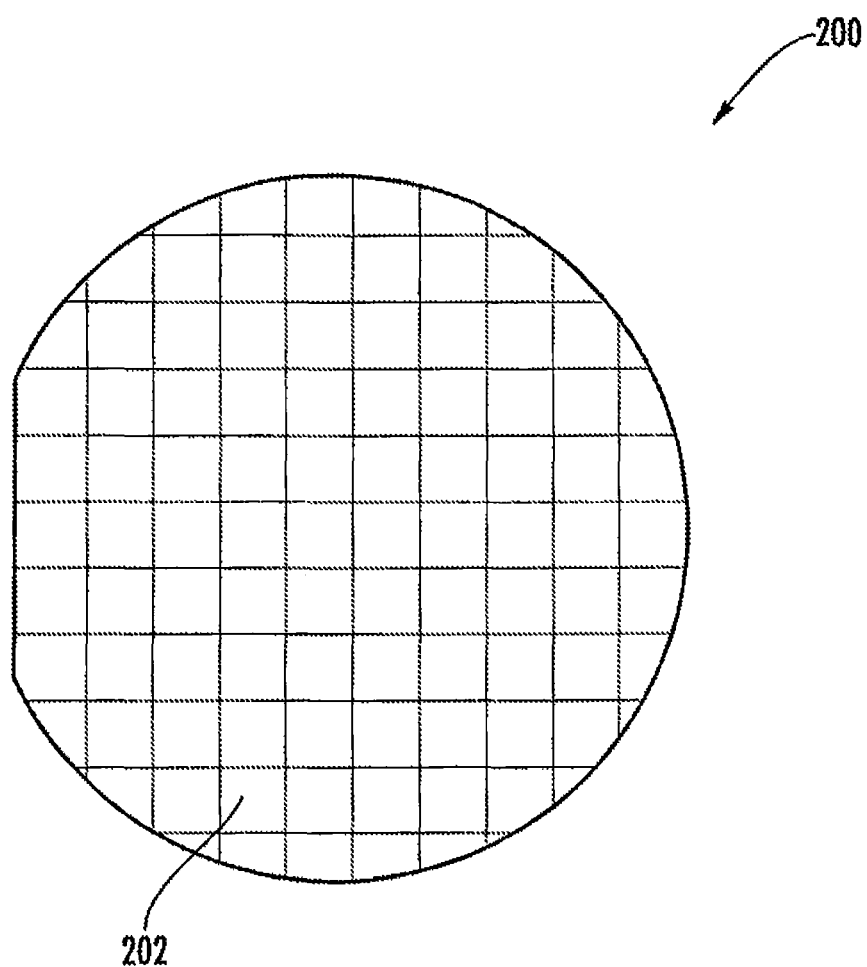
FIG. 2 illustrates an example wafer according to embodiments of the present invention. The wafer of FIG. 2 also illustrates the die that would be cut from the wafer to form devices.

FIG. 2 is a schematic illustration of a substantially circular wafer cut from a crystal made according to an embodiment of the invention. Wafer 200 can be cut into die, wherein a die 202 can be used to form a device. Further processing, including, but not limited to, the depositing of additional layers of semiconductor material prior to cutting the wafer may be necessary to form working devices. To be put into use, a finished device may also need to be encapsulated in a package with appropriate contacts for mounting and/or connection within a circuit.

Figure 3:
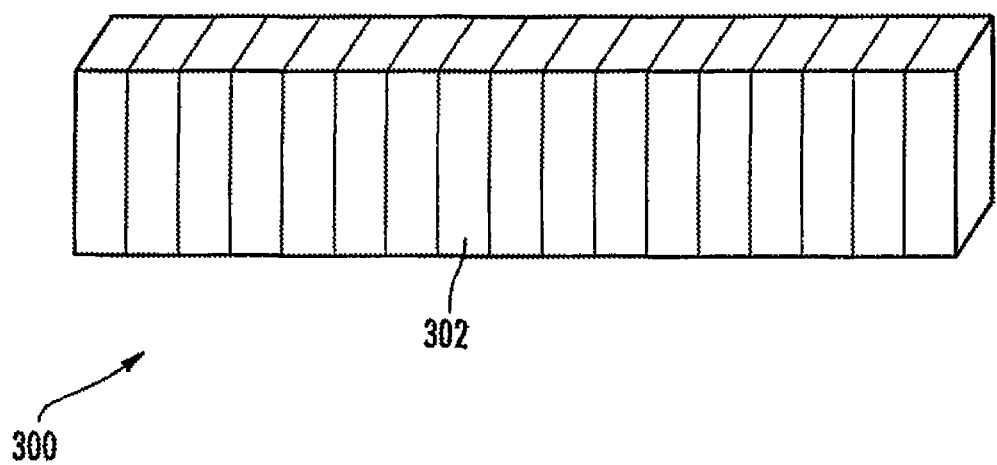
FIG. 3 illustrates another example wafer according to embodiments of the present invention. The wafer of FIG. 3 also illustrates the die that would be cut from the wafer to form devices.

FIG. 3 is a schematic illustration of a substantially rectangular wafer cut from a crystal made according to an embodiment of the invention. Wafer 300 can again be cut into die, wherein a die 302 can be used to form a device. Wafers according to an embodiment of the invention can be of various shapes and sizes. In the case of a substantially circular wafer, the term "dimension," as in a dimension being from 50 mm to 300 mm refers to the diameter. In the case of a rectangular wafer, this dimension refers to a length of one of the sides, for example, the length in the longest side. The dimension of a wafer can be from 50 mm to 200 mm, from 50 mm to 300 mm, or from 100 mm to 300 mm, as examples.

In example embodiments, SiC material, whether in a crystal, wafer, or die form factor, includes a dopant in a concentration from $1 \times 10^{18}$ cm$^{-3}$ to $1 \times 10^{21}$ cm$^{-3}$. In some embodiments, the concentration of the dopant is from $1 \times 10^{18}$ cm$^{-3}$ to $1 \times 10^{20}$ cm$^{-3}$. In some embodiments, the concentration of the dopant is from $1 \times 10^{18}$ cm$^{-3}$ to $1 \times 10^{19}$ cm$^{-3}$. In some embodiments, the SiC crystal and/or wafer further comprises a strain compensating component at a concentration between 1% and 20% of the concentration of the dopant. In some embodiments, the concentration will be between 1% and 180%. In some embodiments, the concentration will be between 3% and 120%. In some embodiments, the concentration will be between 5% and 100%. In some embodiments, the concentration will bet between 20% and 100%. In some embodiments, the strain compensating component is selected from a group comprising germanium, tin, arsenic, phosphorus, and combinations thereof. In some embodiments, the strain compensating component comprises germanium and the dopant is an n-type dopant such as nitrogen.

The material can also be specified in terms of the strain compensating component, whether germanium or another element. In some embodiments, the concentration of the strain compensating component in the SiC crystal and/or wafer is from $1 \times 10^{17}$ cm$^{-3}$ to $2 \times 10^{21}$ cm$^{-3}$. In some embodiments, the concentration of strain compensating component is from $2 \times 10^{17}$ cm$^{-3}$ to $1.8 \times 10^{20}$ cm$^{-3}$. In some embodiments, the concentration of strain compensating component is from $1 \times 10^{18}$ cm$^{-3}$ to $1.8 \times 10^{19}$ cm$^{-3}$. The ratio of the strain compensating component to the dopant can still be maintained at from 1% to 180%. In some embodiments, the concentration will be between 1% and 20%. In some embodiments, the concentration will be between 3% and 120%. In some embodiments, the concentration will be between 5% and 100%. In some embodiments, the concentration will bet between 20% and 100%. With any of the combinations of material parameters discussed herein, crystal material with a resistivity of less than 0.01 ohm-cm can be produced. A crystal and/or wafer with a resistivity of less than 0.05 ohm-cm can also be produced. Crystals can also have a resistivity from 0.001 ohm-cm to 0.01 ohm-cm, from 0.005 ohm-cm to 0.01 ohm-cm, or from 0.005 ohm-cm to 0.05 ohm-cm.

It should be noted that with nitrogen as the dopant and germanium as the stress compensating component, very high doping can be achieved because nitrogen solubility is thought to be around $2.6 \times 10^{20}$ or where about 0.5% of the atoms in the SiC crystal are nitrogen. Given the parameters specified herein, the number of germanium atoms required to compensate the stress caused by the highest achievable concentration of nitrogen will be well less than 1% of the number of silicon and carbon atoms, which does not exceed germanium solubility limits. However, germanium incorporation may be limited due to stress (expansion of unit cell) induced by the germanium atom as it incorporates onto a lattice site. Since the incorporation of nitrogen creates an opposite stress (shrinking of unit cell) it is expected that the presence of a high concentration of nitrogen will allow a higher concentration of germanium to be incorporated into the material. In fact by balancing the expansion due to germanium, with the contraction caused by nitrogen, it may be possible to reach significantly higher levels of germanium incorporation than normally seen in unbalanced material, thus allowing germanium concentrations of between $2 \times 10^{18}$ and $2 \times 10^{20}$ cm$^{-3}$ to be achieved. With germanium the nitrogen solubility limit could be higher than $1 \times 10^{21}$ further reducing SiC resistivity (and the solubility limit for germanium).

It should also be noted that the various combinations of materials, concentrations, SiC growth conditions, and SiC wafer sizes mentioned herein are not to be interpreted as being exclusive of other combinations. For example, any concentration mentioned of a dopant may be able to be combined with any concentration mentioned of a strain compensating component in any of variously sized wafers. Portions of the various embodiments discussed can be combined in different ways. It should also be noted that physical properties such as resistivity, concentration and concentration ratios generally apply to wafers cut from a crystal with the given property and vice versa.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A method of producing a silicon carbide wafer, comprising:
    placing a seed in a growth zone;
    introducing a nitrogen dopant and a strain compensating component in the growth zone;
    positioning a source material in the growth zone;
    sublimating a silicon carbide crystal on the seed; and
    cutting the silicon carbide crystal into a wafer,
    wherein the silicon carbide wafer includes the nitrogen dopant at a nitrogen concentration of from $1 \times 10^{18}$ cm$^{-3}$ to $1 \times 10^{21}$ cm$^{-3}$ and the strain compensating component at a strain compensating component concentration of from $2 \times 10^{18}$ cm$^{-3}$ to $2 \times 10^{20}$ cm$^{-3}$, and
    wherein the strain compensating component comprises an isoelectronic element and/or an element with the same majority carrier type as the nitrogen dopant.

2. The method of claim 1 wherein the strain compensating component is selected from a group comprising germanium, tin, arsenic, phosphorus, and combinations thereof.

3. The method of claim 1 wherein the strain compensating component comprises germanium.

4. The method of claim 1 wherein the nitrogen concentration of the nitrogen dopant in the silicon carbide wafer is from $1 \times 10^{18}$ cm$^{-3}$ to $1.8 \times 10^{20}$ cm$^{-3}$.

5. A silicon carbide wafer having a width dimension of from 100 mm to 300 mm comprising a strain compensating component and a n-type dopant at a concentration of about $1 \times 10^{21}$ cm$^{-3}$, a concentration of the strain compensating component in the silicon carbide wafer from 1% to 180% of the concentration of the n-type dopant, the strain compensating component including an isoelectronic element and/or an element with the same majority carrier type as the n-type dopant wherein the strain compensating component is selected from a group comprising germanium, tin, arsenic, phosphorus, all and combinations thereof.

6. The silicon carbide wafer of claim 5 the strain compensating component is in a concentration from $2\times10^{17}$ cm$^{-3}$ to $1\times10^{21}$ cm$^{-3}$.

7. The silicon carbide wafer of claim 5 wherein the strain compensating component comprises germanium and the concentration of the strain compensating component in the silicon carbide wafer is from $2\times10^{17}$ cm$^{-3}$ to $1.8\times10^{20}$ cm$^{-3}$.

8. The silicon carbide wafer of claim 5 wherein the n-type dopant comprises nitrogen.

9. The silicon carbide wafer of claim 5 having a resistivity of less than 0.01 ohm-cm.

10. The silicon carbide wafer of claim 8 wherein the concentration of the strain compensating component is between 3% and 120% of the concentration of nitrogen.

11. The silicon carbide wafer of claim 5 wherein the strain compensating component is selected from a group comprising arsenic, phosphorus, and combinations thereof.

12. A method of producing a silicon carbide wafer, comprising:

placing a seed in a growth zone;
introducing a nitrogen dopant and a strain compensating component in the growth zone;
positioning a source material in the growth zone;
sublimating a silicon carbide crystal on the seed; and
cutting the silicon carbide crystal into a wafer,
wherein the silicon carbide wafer includes the nitrogen dopant at a nitrogen concentration of from $1\times10^{18}$ cm$^{-3}$ to $1\times10^{21}$ cm$^{-3}$ and the strain compensating component at a strain compensating component concentration of from 1% to 180% of the nitrogen concentration, and
wherein the strain compensating component comprises an isoelectronic element and/or an element with the same majority carrier type as the nitrogen dopant.

13. The method of claim 12 wherein the strain compensating component is selected from a group comprising germanium, tin, arsenic, phosphorus, and combinations thereof.

14. The method of claim 12 wherein the strain compensating component comprises germanium.

15. The method of claim 12 wherein the nitrogen concentration of the nitrogen dopant in the silicon carbide wafer is from $1\times10^{18}$ cm$^{-3}$ to $1.8\times10^{20}$ cm$^{-3}$.

* * * * *